(12) United States Patent

Yoo et al.

(10) Patent No.: US 9,293,215 B2
(45) Date of Patent: Mar. 22, 2016

(54) REFERENCE CURRENT CIRCUIT WITH TEMPERATURE COEFFICIENT CORRECTION

(71) Applicant: Integrated Silicon Solution, Inc., Milpitas, CA (US)

(72) Inventors: Sung Jin Yoo, San Jose, CA (US); Luis Kang, Cupertino, CA (US)

(73) Assignee: Integrated Silicon Solution, Inc., Milpitas, CA (US)

( * ) Notice: Subject to any disclaimer, the term of this patent is extended or adjusted under 35 U.S.C. 154(b) by 15 days.

(21) Appl. No.: 14/218,543

(22) Filed: Mar. 18, 2014

(65) Prior Publication Data

US 2015/0270006 A1    Sep. 24, 2015

(51) Int. Cl.
*G11C 7/02* (2006.01)
*G11C 16/28* (2006.01)
*G11C 7/04* (2006.01)
*G11C 7/06* (2006.01)

(52) U.S. Cl.
CPC ........... *G11C 16/28* (2013.01); *G11C 7/04* (2013.01); *G11C 7/062* (2013.01); *G11C 2207/063* (2013.01)

(58) Field of Classification Search
CPC ............ G11C 16/28; G11C 7/04; G11C 7/062
USPC ................................. 365/189.15, 207, 210.1
See application file for complete search history.

(56) References Cited

U.S. PATENT DOCUMENTS

| 6,438,038 | B2 * | 8/2002 | Ikehashi et al. ........... 365/185.24 |
|---|---|---|---|
| 6,535,426 | B2 | 3/2003 | Michael et al. |
| 7,251,178 | B2 * | 7/2007 | Gogl et al. ..................... 365/209 |
| 7,352,618 | B2 | 4/2008 | Kim et al. |
| 7,376,044 | B2 | 5/2008 | Cho |
| 7,542,348 | B1 | 6/2009 | Kim |
| 7,751,252 | B2 | 7/2010 | Kashiwagi et al. |
| 8,120,966 | B2 | 2/2012 | Lee |
| 8,339,886 | B2 * | 12/2012 | Wang ............................ 365/205 |
| 8,553,456 | B2 | 10/2013 | Cho |
| 8,634,241 | B2 | 1/2014 | Lee et al. |
| 8,687,412 | B2 * | 4/2014 | Chih et al. ........... G11C 11/161 365/158 |
| 2006/0050584 | A1 * | 3/2006 | Gogl et al. ..................... 365/207 |
| 2012/0206986 | A1 * | 8/2012 | Wang ............................ 365/203 |
| 2013/0258762 | A1 * | 10/2013 | Chih et al. ........... G11C 11/161 365/158 |

* cited by examiner

*Primary Examiner* — Richard Elms
*Assistant Examiner* — Xiaochun L Chen
(74) *Attorney, Agent, or Firm* — Van Pelt, Yi & James LLP (57) ABSTRACT

A flash memory device uses a pair of parallely connected NMOS transistors with different voltage ratings to generate the reference current for the sense amplifier used in the read out operations. The reference current thus generated is temperature compensated with zero or near-zero temperature coefficient. In some embodiments, the pair of parallely connected NMOS transistors includes a high voltage NMOS transistor and a low voltage NMOS transistor or NMOS transistors with different gate oxide thicknesses.

20 Claims, 5 Drawing Sheets

REFERENCE CURRENT CIRCUIT WITH TEMPERATURE COEFFICIENT CORRECTION

BACKGROUND OF THE INVENTION

Non-volatile memory (NVM) is a memory device that retains content stored therein even when power is removed. EEPROM and flash memory are two commonly used non-volatile memory devices. In particular, flash memory has become widely used in electronic devices, especially portable electronic devices, because of its ability to provide data storage at low power levels. Modern day flash memory devices are typically implemented using a floating gate MOS transistor device as the memory cells. A floating gate MOS transistor device includes a floating gate that is formed between a control gate and the channel region (the substrate) of the MOS device and at least partially vertically aligned with the control gate. Charge storage on the floating gate determines the stored data state ("0" or "1") of the memory cell.

A flash memory cell is read by applying a gate bias to the control gate and sensing the stored data state on the drain terminal of the flash memory cell, which is coupled to the bit line of the memory array. To enable fast read access, the sensing of the stored data on the bit line is typically accomplished using a sense amplifier which compares the current on the bit line with a reference current. Conventional flash memory device uses a reference flash memory cell having the same construction as the flash memory cell in the memory array to generate the reference current. However, the reference flash memory cell and associated circuitry consumes large silicon real estate. Furthermore, a flash memory cell can suffer from cell disturb issue after the flash memory cell has been subjected to many excitation cycles. In particular, since a reference flash memory cell is used for the read operation of multiple memory cells and the reference flash memory cell is thus put through the read operation for a large number of cycles as compared to the memory cells themselves. After many read cycles, the reference memory cell may become degraded so that the reference flash memory cell does not generate the same reference current anymore. The changing or drifting of the reference current over the operational life of the flash memory device is undesirable as it affects the read access time of the memory cells. In some cases, a flash memory device uses an NMOS transistor to generate the reference current. However, the reference current thus generated has a large variation as a function of temperature.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a flash memory device uses a pair of parallely connected NMOS transistors with different voltage ratings to generate the reference current for the sense amplifier used in the read out operations. The reference current thus generated is temperature compensated with zero or near-zero temperature coefficient. Furthermore, by using NMOS transistors instead of flash memory cell to generate the sense amplifier reference current, flash cell disturb issue or degradation of the reference current over time is avoided. In some embodiments, the pair of parallely connected NMOS transistors includes a high voltage NMOS transistor and a low voltage NMOS transistor.

Figure 1:
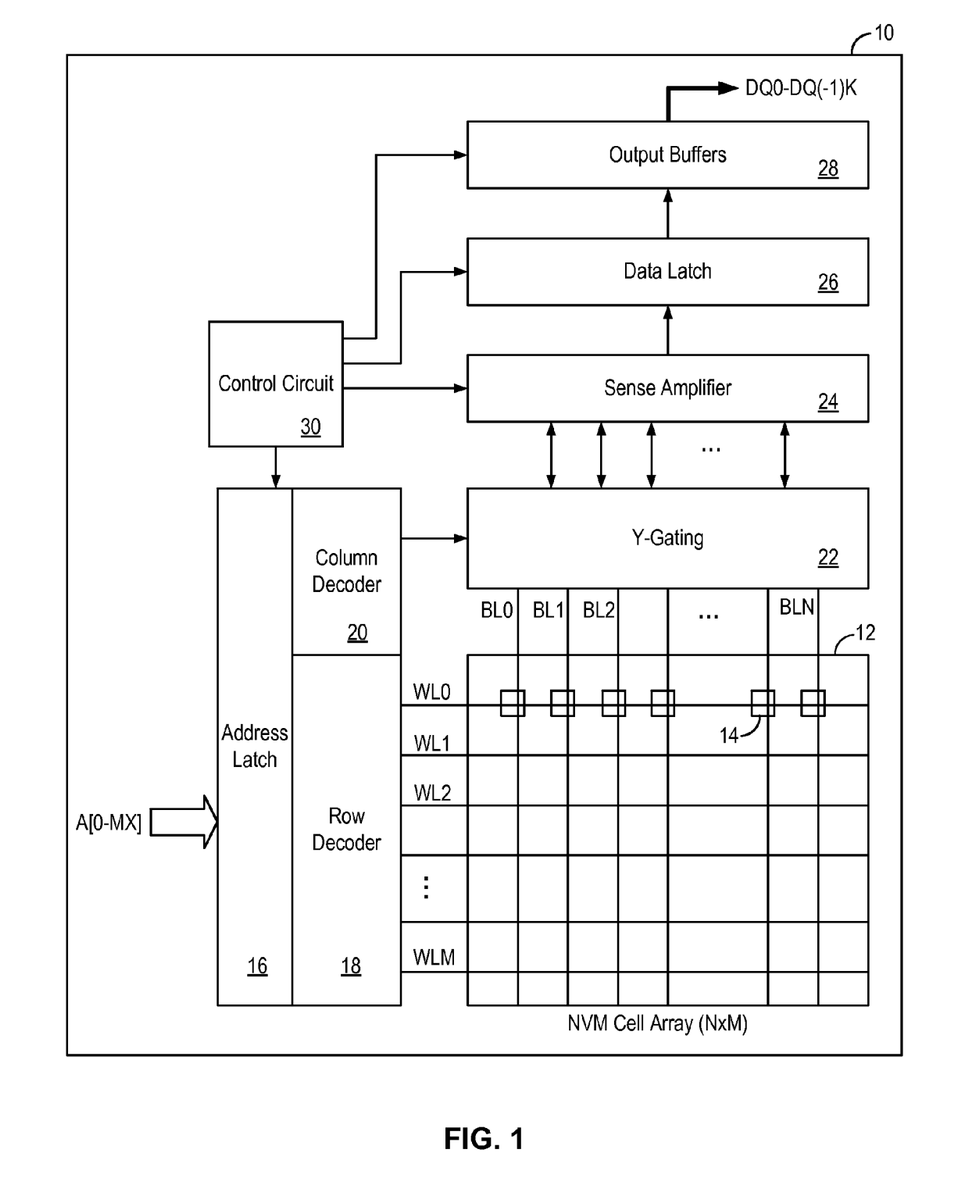
FIG. 1 is a block diagram of a non-volatile memory (NVM) device in one exemplary embodiment.

FIG. 1 is a block diagram of a non-volatile memory (NVM) device in one exemplary embodiment. FIG. 1 is illustrative only and the NVM device may include additional components not shown in FIG. 1. In particular, FIG. 1 illustrates the elements of a NVM device related to the read operation of the memory device. Referring to FIG. 1, the NVM device 10 includes a two-dimensional array 12 of non-volatile memory cells 14. In the present embodiment, NVM device 10 is implemented as a flash memory device and non-volatile memory cells 14 are implemented as flash memory cells. In other embodiments, the NVM device 10 may be implemented as other types of non-volatile memory device.

In embodiments of the present invention, flash memory cells 14 may be configured as a NAND flash memory array or a NOR flash memory array. The cell array 12 is addressed by a row decoder 18 and a column decoder 20 to selectively access the memory cells 14 for read, program (write) and erase operations. In particular, an address A[0-MX] is received at an address latch 16 and the received address is decoded by the row decoder 18 which selects the word lines and the column decoder 20 which selects the bit lines of the memory array 12. The flash memory cells 14 in the array 12 are accessed by word lines WL0 to WLM and bit lines BL0 and BLN. The row decoder 18 selectively activates a word line from WL0 to WLM. The column decoder selectively activates a bit line from BL0 to BLN through the Y-gating circuit 22 to allow a memory cell 14 at the intersection of the selected word line and selected bit line to be accessed. To read data from the memory array 12, the Y-gating circuit 22 connects the bit lines to a sense amplifier 24. In practice, the sense amplifier 24 includes a bank of sense amplifiers (or sense amplifier circuits), one sense amplifier for each input/output (I/O) of the flash memory device. Each sense amplifier is coupled to a block of memory cells 14 in the cell array 12. For example, when the flash memory device 10 generates output data in K-bit (i.e. K-bit I/O), the sense amplifier 24 may include K sense amplifier circuits, each sense amplifier circuit being coupled to a block of bits lines associated with a databit of the output data. The sense amplifier 24 may be coupled to a data latch 26 to store the data read out of the cell array 12. The data latch 26 is coupled to output buffers 28 configured to provide the data read out DQ0 to DQ(K−1) to external circuits. A control circuit 30 is configured to control the operation of the decoders, the sense amplifier, the data latch and the output buffers. The memory architecture shown in FIG. 1 is illustrative only and it will be appreciated that the structure and methods described herein may be utilized in other memory architectures.

Figure 2:
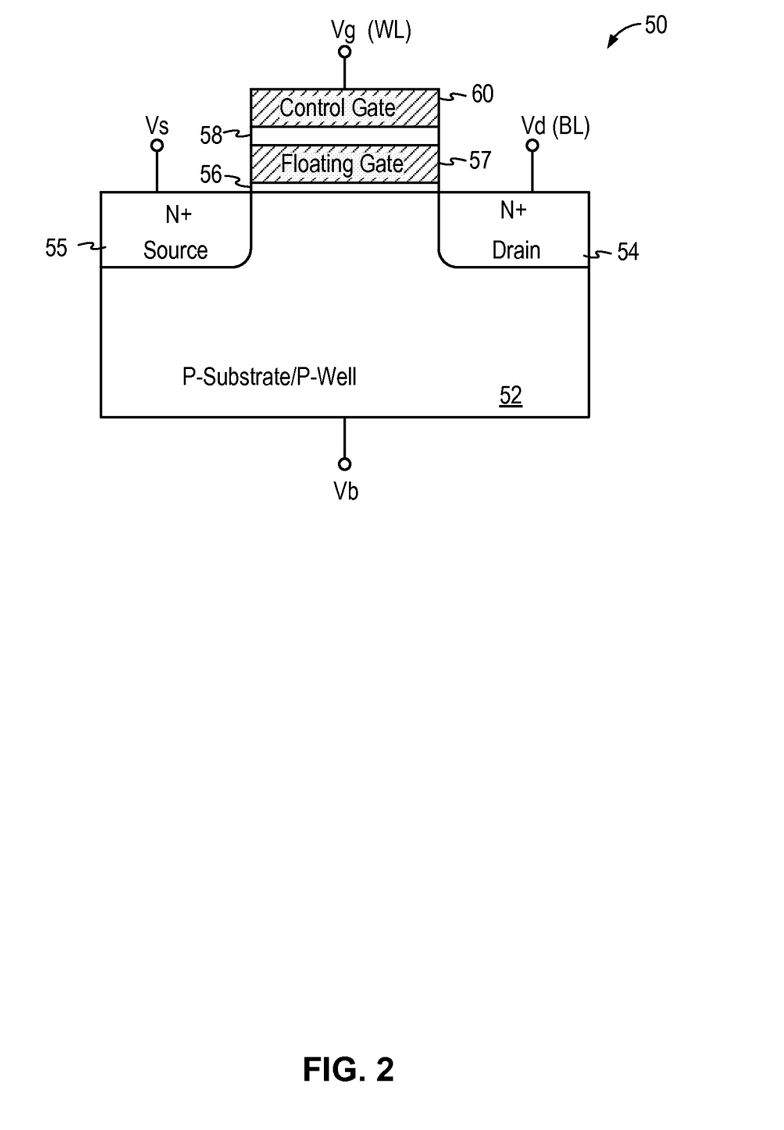
FIG. 2 is a cross-sectional view of a flash memory cell implemented using a floating gate MOS transistor device in some examples of the present invention.

In the present embodiment, flash memory cells 14 are implemented using a floating gate MOS transistor device, as shown in FIG. 2. Referring to FIG. 2, a floating gate MOS transistor device 50 includes a source region 55, a drain region 54, a control gate 60 and a floating gate 57. The source and drain regions are formed in a semiconductor layer 52 with the channel region disposed in between the source and the drain regions. In some examples, the semiconductor layer 52 can be a well region or a semiconductor substrate. In the present example, the floating gate MOS transistor device 50 is formed as an N-type device and the semiconductor layer 52 is a P-type well region with the source and drain regions being heavily doped N+ regions formed in the P-well region 52. The floating gate 57 and the control gate 60 are vertically disposed above the channel region and at least partially overlapped. The floating gate 57 is electrically isolated from the P-type well region 52 by a thin gate oxide layer 56 (also referred to as the "tunnel oxide layer") and is electrically isolated from the control gate 60 by another dielectric layer 58 which can be a dielectric film or a stack of different dielectric films. The control gate 60 of the floating gate MOS transistor device 50 is coupled to the word line of the cell array while the drain region is coupled to the bit line of the cell array. In a NOR flash memory, the source regions of the floating gate MOS transistor devices are connected to a shared source line which is typically connected to the ground potential.

The operation of the flash memory device 10 and the floating gate flash memory cell 50 is well known and will be described in brief. In the present example, the flash memory cell is adapted to store one bit of data. The flash memory cell has a logical state of "1" when the cell is erased and a logical state of "0" when the cell is programmed. It is understood that flash memory cells may be constructed to operate in the opposite logical states.

First, programming or writing data to the flash memory cell is performed by transferring charge carriers from the semiconductor layer 52 to the floating gate 57 by tunneling through the thin gate oxide layer 56. For example, an elevated gate voltage (e.g. Vg=12V) is applied to the control gate to turn on the channel and electrons can flow from the source to the drain. The P-well region 52 is typically grounded. An elevated drain voltage (e.g. Vd=5V) is applied to the drain region 54 relative to the source region 55 to generate electrons with sufficiently high energy ("hot electrons") so that hot electronic injection occurs and hot electrons jump through the thin gate oxide layer 56 onto the floating gate 57. When the biasing voltages are removed, the charges are trapped on the floating gate 57 and the memory cell is programmed to a logical state of 0.

Second, erasing the flash memory cell is performed by transferring charge carriers from the floating gate to the semiconductor layer 52 (or P-well 52) by quantum tunneling or Fowler-Nordheim tunneling. The erase operation can be carried out using source erase operation or channel erase. To perform source erase, an elevated negative voltage (e.g. Vg=−10V) is applied to the control gate 60 and the substrate is at ground. A positive voltage (e.g. Vs=6V) is applied to the source region 55 with the drain region 54 being grounded or floating. Electrons are pull off the floating gate into the source through quantum tunneling. When the floating gate is left with no charge carriers, the memory cell has a logical state of 1. To perform channel erase, an elevated negative voltage (e.g. Vg=−8V) is applied to the control gate 60 and a positive voltage (e.g. Vb=8V) is applied to the semiconductor layer or P-well 52. The source region 55 and the drain region 54 are left floating. Electrons are pull off the floating gate into the substrate through quantum tunneling. When the floating gate is left with no charge carriers, the memory cell has a logical state of 1.

Flash memory cells can be programmed individually but are usually erased as a block or a sector. Each erase operation includes the application of an erase pulse followed by an erase verify cycle to ensure that all memory cells are indeed erased. If some of the memory cells are not erased, then another erase pulse is applied and the process repeats until all memory cells are erased. In both source erase and channel erase operations, the magnitude and the duration of the voltage bias can vary and are selected to ensure that all memory cells in a sector a block are erased. In most cases, the flash memory device is erased using a repeated erase-verify operation when the memory cells are verified to be erased after an erase cycle and the erase cycle is repeated if not all memory cells are erased.

Finally, a flash memory cell is read by applying a gate voltage that is an intermediate threshold voltage of an erased memory cell and a programmed memory cell. When a flash memory cell is erased, the floating gate carries no charge and the memory cell transistor can be turned on by the application of a first threshold voltage. However, when the flash memory cell is programmed, the negative charge on the floating gate screens the electric field from the control gate, the memory cell transistor thus requires a second threshold voltage higher than the first threshold voltage to turn on. Thus, to read a flash memory cell, a gate voltage between the first and second threshold voltages are applied to the control gate and a drain voltage, smaller than the gate voltage, is applied to the drain. If a current is measured at the drain terminal, then the memory cell is not programmed and has a logical state of 1. If no current is measured at the drain terminal, then the memory cell is programmed and has a logical state of 0.

To access a flash memory cell in the cell array 12, an input address A[0-MX] (FIG. 1) is provided to flash memory device 10. The input address is latched by the address latch 16 and the latched address is divided into a row address which is coupled to the row decoder 16 and a column address which is coupled to the column decoder 18. Row decoder decodes the row address and activates one word line out of word lines WL0 to WLM and column decoder decodes the column address and activates one bit line out of bit lines BL0 to BLN.

In this manner, the memory cell associated with the activated word line and the activated bit line is made available for either read, write or erase operation. In practice, the flash memory device activates the memory cells associated with all of the I/Os of the memory device. For example, the memory cells associated with one byte of data or eight I/Os, may be activated for access based on the input address. More specifically, the conventional flash memory device activates one bit line for each associated sense amplifier in the flash memory device. In the following description, the operation of the flash memory device will be described with reference to a single sense amplifier or a single I/O. It is understood that the flash memory device includes a bank of sense amplifiers for a set of I/Os, such as a byte of data.

In the flash memory device 10, to read out data from a flash memory cell 14, a memory cell is selected by activating a respective word line and a respective bit line and the current that flows in the memory cell is measured. The current that flows through the memory cell is measured at the drain terminal which is coupled to the bit line. The amount of current that flows through the selected memory cell is a function of the logical state of the memory cell. In the present example, if a current is measured at the drain terminal, then the memory cell is not programmed and has a logical state of 1. On the other hand, if no current is measured at the drain terminal, then the memory cell is programmed and has a logical state of 0. In the present description, the current that flows through a memory cell during a read operation is referred to as the "cell current" or the "bit line current." The current that flows through the memory cell during a read operation is measured by the sense amplifier 24.

Figure 3:
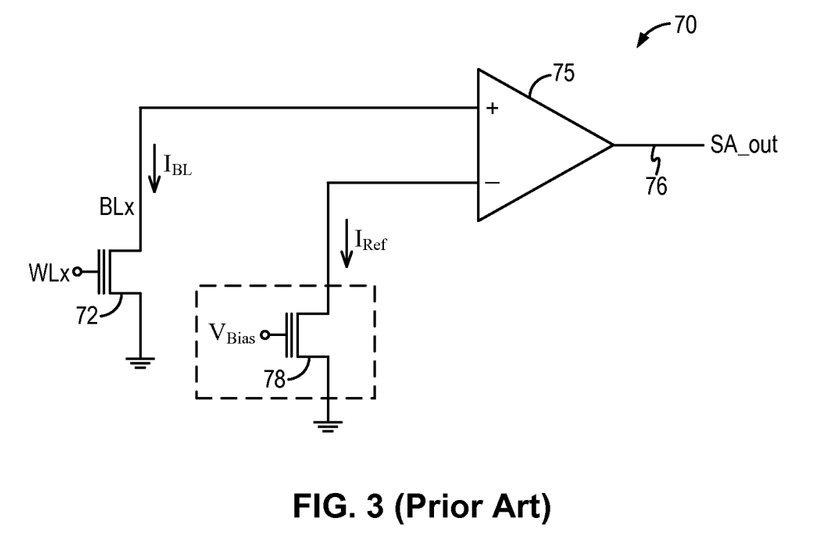
FIG. 3 illustrates a conventional sense amplifier for measuring the flash memory cell current in a read operation.

FIG. 3 illustrates a conventional sense amplifier for measuring the flash memory cell current in a read operation. In the conventional implementation, a sense amplifier 70 is configured as a differential amplifier 75 to sense and amplify a difference between the bit line current $I_{BL}$ of a selected flash memory cell 72 and a reference current $I_{Ref}$ and to generate a sense amplifier output signal SA_out (node 76) indicative of the current differential at its input terminals. The selected flash memory cell 72 may be associated with the word line WLx and the bit line BLx. In the conventional implementation, the sense amplifier 70 receives a reference current $I_{Ref}$ that is generated by a reference flash memory cell 78. The reference flash memory cell 78 is constructed in the same manner as the flash memory cells 72 in the memory array and is biased by a bias voltage $V_{Bias}$ to provide the reference current $I_{Ref}$. As described above, because the same reference flash memory cell 78 is used for the read operation of a block of memory cells in the array, the reference flash memory cell 78 may suffer from cell disturb issue where the reference flash memory cell may become degraded over many read cycles so that the reference current value varies or drifts over time.

In embodiments of the present invention, a non-volatile memory device includes a sense amplifier that receives a reference current generated by a pair of parallely connected NMOS transistors with different voltage ratings. The reference current thus generated is temperature compensated and does not suffer from the cell disturb issue associated with using a reference flash memory cell to generate the reference current.

Figure 4:
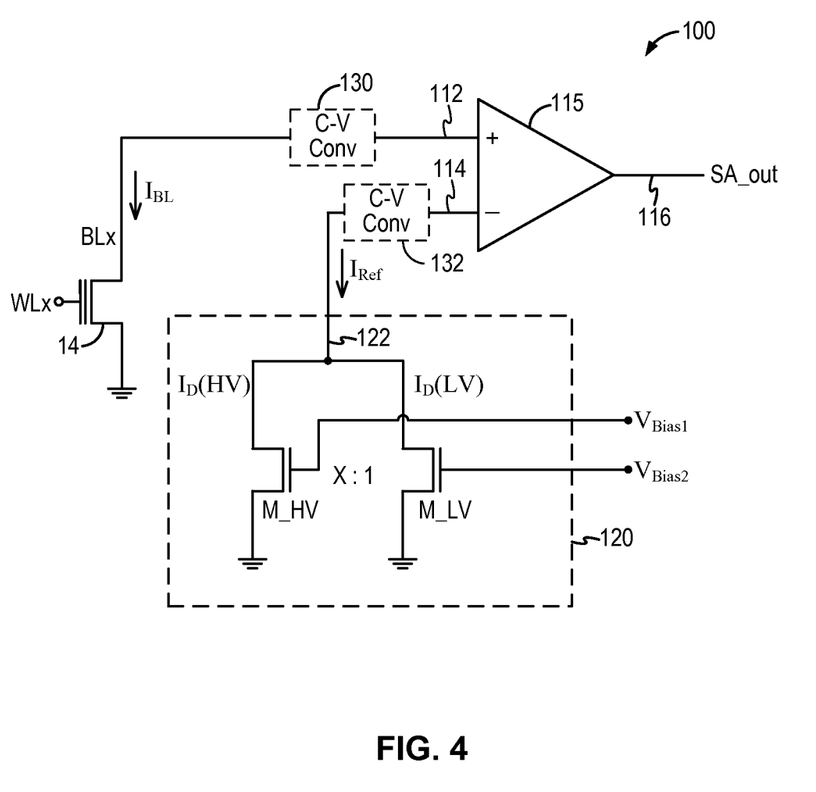
FIG. 4 illustrates a sense amplifier in a flash memory device for measuring the flash memory cell current in a read operation in embodiments of the present invention.

FIG. 4 illustrates a sense amplifier in a flash memory device for measuring the flash memory cell current in a read operation in embodiments of the present invention. Referring to FIG. 4, a sensor amplifier 100 is configured as a differential amplifier 115 to sense and amplify a difference between the bit line current $I_{BL}$ of a selected flash memory cell 14 and a reference current $I_{Ref}$. The selected flash memory cell 14 may be associated with the word line WLx and the bit line BLx. The sense amplifier 100 generates a sense amplifier output signal SA_out (node 116) indicative of the current differential at the input terminals 112, 114 of the differential amplifier 115. In some embodiments, the sense amplifier 100 may further includes current-to-voltage circuits 130 and 132 configured to convert the bit line current $I_{BL}$ and the reference current $I_{Ref}$ to respective bit line voltage $V_{BL}$ and reference voltage $V_{Ref}$. The differential amplifier 115 may be configured to sense the voltage difference between the bit line voltage $V_{BL}$ and the reference voltage $V_{Ref}$ and generate the sense amplifier output signal SA_out indicative of the sensed voltage differential at the input terminals 112, 114.

In sense amplifier 100, a reference current generating circuit 120 generates the reference current $I_{Ref}$ being a temperature compensated reference current. In embodiments of the present invention, the reference current generating circuit 120 includes a pair of parallely connected NMOS transistors with different voltage ratings. In particular, the reference current generating circuit 120 includes a high voltage NMOS transistor M_HV and a low voltage NMOS transistor M_LV connected in parallel between the negative input terminal 114 of the differential amplifier 115 and the ground potential. In the present embodiment, the high voltage NMOS transistor M_HV refers to an NMOS transistor having a thick gate oxide layer so that the NMOS transistor is capable of sustaining a high applied voltage. In some examples, the high voltage NMOS transistor is built using a gate oxide layer having a thickness of about 160 Å and the high voltage NMOS transistor has a voltage rating of about 11-12V. Moreover, in the present embodiment, the low voltage NMOS transistor M_LV refers to an NMOS transistor having a thin gate oxide layer so that the NMOS transistor is capable of sustaining a nominal applied voltage. In some examples, the low voltage NMOS transistor is built using a gate oxide layer having a thickness of about 45-90 Å and the low voltage NMOS transistor has a voltage rating of about 3V. In the present description, a high voltage NMOS transistor is also referred to as a "thick gate oxide NMOS transistor" and a low voltage NMOS transistor is also referred to as a "thin gate oxide NMOS transistor." The gate oxide layer of the high voltage NMOS transistor has a thickness greater than the thickness of the gate oxide layer of the low voltage NMOS transistor.

The high voltage NMOS transistor M_HV is biased by a gate voltage $V_{Bias1}$ to generate a drain current $I_D(HV)$. The low voltage NMOS transistor M_LV is biased by a gate voltage $V_{Bias2}$ to generate a drain current $I_D(LV)$. The drain currents $I_D(HV)$ and $I_D(LV)$ are summed at a current summing node 122 to form the reference current $I_{Ref}$. As described above, the reference current $I_{Ref}$ may be provided to the differential amplifier 115 directly or may be provided to the current-to-voltage converter 124 to be converted into a reference voltage value. The reference voltage value is then provided to the differential amplifier 115.

The drain current of an NMOS transistor exhibits certain temperature dependent characteristics over a range of the applied gate-to-source voltage ($V_{GS}$). In particular, the temperature dependent characteristics of the drain current include a cross-point where the temperature dependency of the drain current changes polarity. That is, the drain current of an NMOS transistor increases with temperature when the gate-to-source voltage is below the cross-point voltage. However, the drain current of the NMOS transistor decreases with temperature when the gate-to-source voltage becomes greater than the cross-point voltage. In embodiments of the present invention, the reference current generating circuit 120 exploits the differences in temperature dependent characteristics of the drain current for a high voltage transistor as compared to a low voltage transistor to generate a temperature compensated reference current for the sense amplifier.

Figure 5:
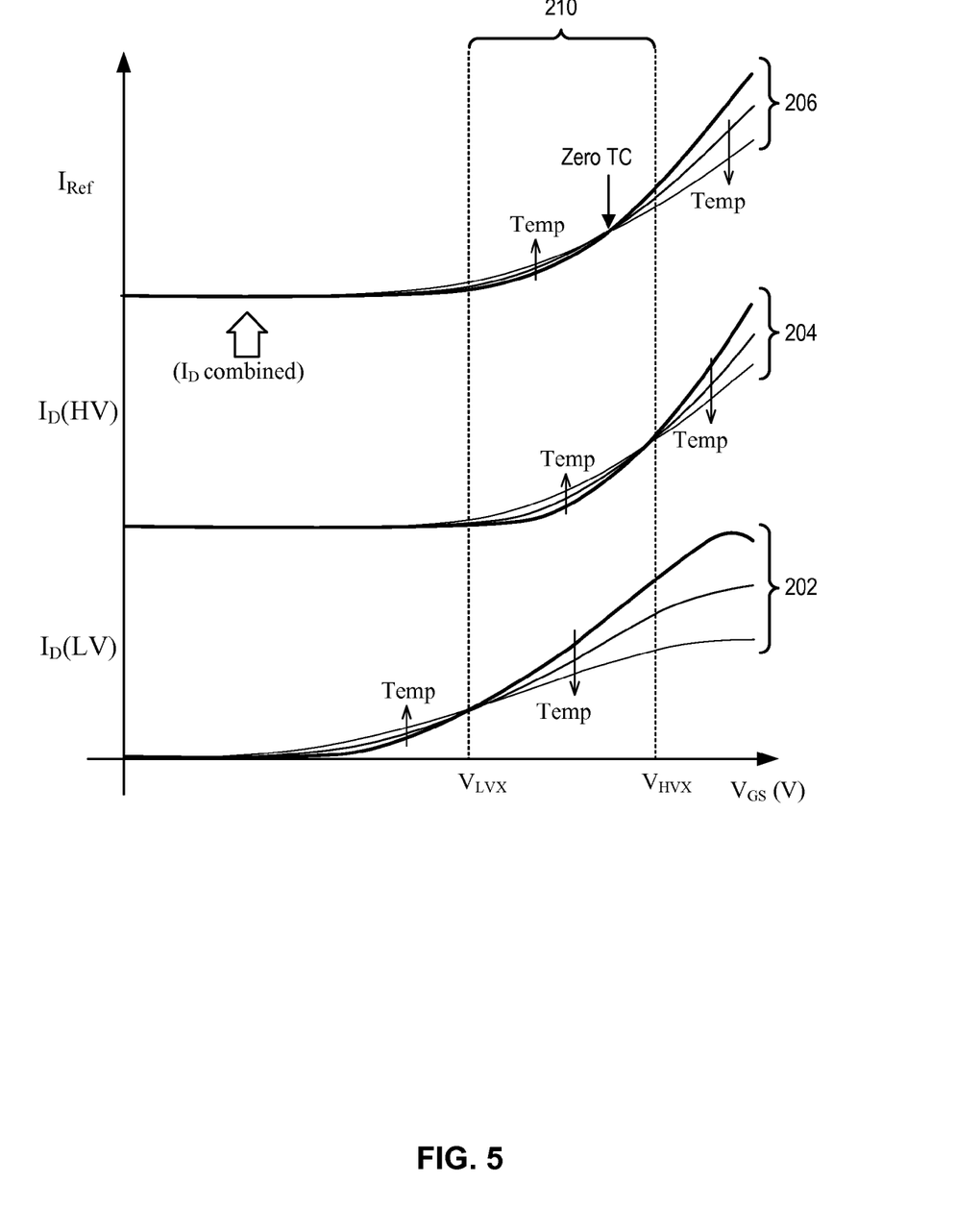
FIG. 5 illustrates the temperature dependent characteristics of the drain currents of the high voltage NMOS transistor and the low voltage NMOS transistor as well as the reference current thus generated in embodiments of the present invention.

FIG. 5 illustrates the temperature dependent characteristics of the drain currents of the high voltage NMOS transistor and the low voltage NMOS transistor as well as the reference current thus generated in embodiments of the present invention. Referring to FIG. 5, the set of curves 202 illustrates the variation of the drain current $I_D(LV)$ of the low voltage NMOS transistor over temperature as a function of the gate-to-source voltage $V_{GS}$. The temperature dependent characteristics of the drain current $I_D(LV)$ has a cross-point at a gate-to-source voltage of $V_{LVX}$. When the voltage $V_{GS}$ is below the cross-point voltage $V_{LVX}$, the drain current $I_D(LV)$ increases as temperature increases. When the voltage $V_{GS}$ becomes greater than the cross-point voltage $V_{LVX}$, the drain current $I_D(LV)$ decreases as temperature increases.

The high voltage NMOS transistor has a similar temperature dependent characteristics as the low voltage NMOS transistor. The set of curves 204 illustrates the variation of the drain current $I_D(HV)$ of the high voltage NMOS transistor over temperature as a function of the gate-to-source voltage $V_{GS}$. The temperature dependent characteristics of the drain current $I_D(HV)$ has a cross-point at a gate-to-source voltage of $V_{HVX}$. When the voltage $V_{GS}$ is below the cross-point voltage $V_{HVX}$, the drain current $I_D(HV)$ increases as temperature increases. When the voltage $V_{GS}$ becomes greater than the cross-point voltage $V_{HVX}$, the drain current $I_D(HV)$ decreases as temperature increases.

Importantly, the cross-point voltage $V_{HVX}$ for the high voltage NMOS transistor is greater than the cross-point voltage $V_{LVX}$ for the low voltage NMOS transistor. Thus, there exists a gate voltage range 210 in which the temperature dependent characteristics of the high voltage and low voltage NMOS transistors are opposite of each other. That is, within the gate voltage range 210, the drain current $I_D(LV)$ of the low voltage NMOS transistor decreases with increasing temperature while the drain current $I_D(HV)$ of the high voltage NMOS transistor increases with increasing temperature. When the drain current $I_D(LV)$ is summed with the drain current $I_D(HV)$ to generate the reference current $I_{Ref}$, the two opposing temperature dependency has the effect of canceling out the variation due to temperature so that the reference current $I_{Ref}$ exhibits little or no temperature coefficient in the gate voltage region 210. In particular, within the gate voltage region 210, there is a point at which the reference current has a zero temperature coefficient (or zero TC). At the zero temperature coefficient point, the reference current $I_{Ref}$ does not vary with temperature.

In embodiments of the present invention, the reference current generating circuit 120 of the present invention exploits the zero temperature coefficient characteristic of the summed drain currents of a high voltage NMOS transistor and a low voltage NMOS transistor to generate a temperature compensated reference current for use as the reference current for the sense amplifier. The reference current generating circuit 120 may adjust the size ratio of the high voltage transistor M_HV and the low voltage transistor M_LV for a given fixed gate bias to set the summed current to the zero temperature coefficient point. Alternately, the reference current generating circuit 120 may adjust the bias voltages applied to the high voltage transistor M_HV and the low voltage transistor M_LV for a given size ratio to set the summed current to the zero temperature coefficient point. In the present description, the "size" of the NMOS transistor refers to the width and channel length of the NMOS transistor. It is understood that the NMOS transistor has a first dimension being the channel length of the transistor where the channel length is the distance between the source region and the drain region of the transistor. The NMOS transistor has a second dimension perpendicular to the first dimension being the width of the transistor. In the present description, the size of the NMOS transistor can be adjusted by varying the width and/or length of the transistor, such as by increasing or decreasing the width and/or length of the transistor.

Figure 6A:
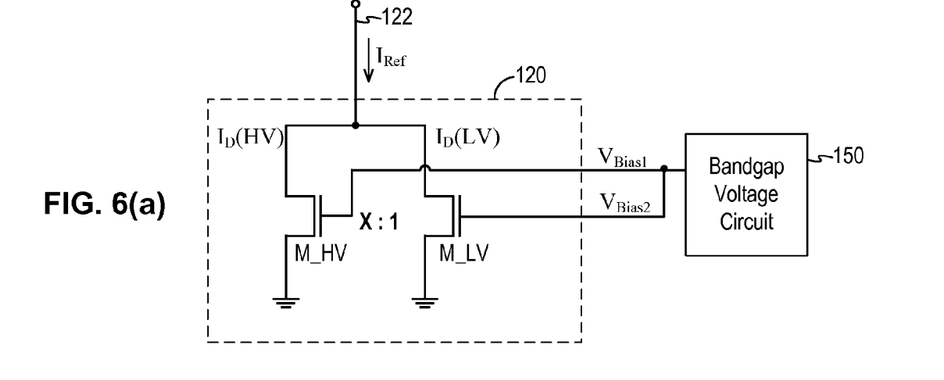
FIGS. 6(a) to 6(c) illustrate various methods which may be employed by the reference generating circuit to set the reference current to the zero temperature coefficient point according to exemplary embodiments of the present invention.
Figure 6B:
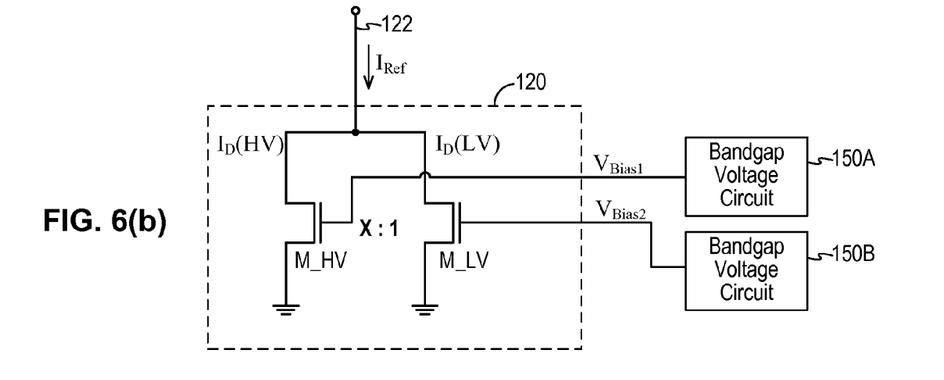
Figure 6C:
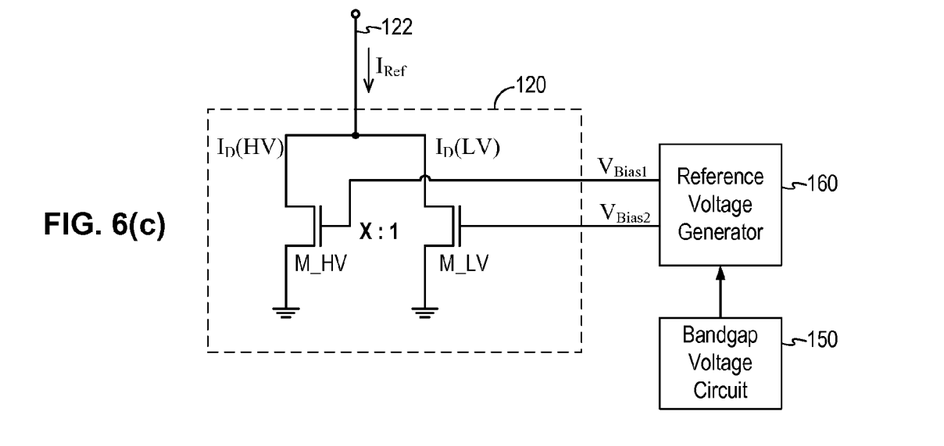

FIGS. 6(a) to 6(c) illustrate various methods which may be employed by the reference generating circuit to set the reference current to the zero temperature coefficient point according to exemplary embodiments of the present invention. Referring first to FIGS. 6(a) and 6(b), the reference current generating circuit 120 may apply a fixed gate bias voltage for the high voltage transistor M_HV and the low voltage transistor M_LV. In the present example, the fixed gate bias voltage is a bandgap reference voltage generated by a bandgap voltage circuit 150. In other examples, the fixed gate bias voltage may be a CMOS reference voltage or other suitable fixed gate bias voltage. The reference current generating circuit 120 adjusts the size ratio X:1 of the high voltage transistor M_HV to the low voltage transistor M_LV to set the summed current or the reference current $I_{Ref}$ to the zero temperature coefficient point. For example, a size ratio of 3:1 of the high voltage transistor M_HV to the low voltage transistor M_LV may be used.

The fixed gate bias voltage may be generated by a single bandgap voltage circuit 150, as shown in FIG. 6(a). Thus, both bias voltages $V_{Bias1}$ and $V_{Bias2}$ are generated by the bandgap voltage circuit 150. Alternately, the fixed gate bias voltage may be generated by separate bandgap voltage circuits 150A and 150B, as shown in FIG. 6(b). Thus, bias voltage $V_{Bias1}$ may be generated by a bandgap voltage circuit 150A while bias voltage $V_{Bias2}$ may be generated by a bandgap voltage circuit 150B.

Referring to FIG. 6(c), the reference current generating circuit 120 may include a reference voltage generator 160 to generate the bias voltages $V_{Bias1}$ and $V_{Bias2}$. The reference voltage generator 160 may generate the bias voltages based on a fixed reference voltage, such as a bandgap reference voltage (such as through bandgap voltage circuit 150) or other CMOS reference voltage. The reference voltage generator 160 may adjust the voltage values for the bias voltages $V_{Bias1}$ and $V_{Bias2}$ individually to set the summed current or the reference current $I_{Ref}$ to the zero temperature coefficient point. That is, the bias voltage $V_{Bias1}$ may be the same or different from the bias voltage $V_{Bias2}$. In some cases, the size ratio X:1 of the high voltage transistor M_HV to the low voltage transistor M_LV may further be adjusted in conjunction with adjusting the bias voltages to achieve the optimal zero temperature coefficient operating point.

In some embodiments, to improve the precision of the reference current $I_{Ref}$, trimming or other reference bias control methods may be used to increase the accuracy of the reference current thus generated.

The reference current thus generated achieves many advantages over the conventional method. First, by obviating the use of a reference flash memory cell to generate the reference current, flash memory cell disturb problem is eliminated. Second, by using the summed current of a high voltage NMOS transistor and a low voltage NMOS transistor, a temperature compensated reference current is generated with zero or near-zero temperature coefficient.

In the above described embodiments, the reference current generating circuit uses two parallely connected NMOS transistors of different voltage ratings to generate the temperature compensated reference current. In other embodiments, the reference current generating circuit may use two or more parallely connected NMOS transistors of different voltage ratings to generate the temperature compensated reference current. The size ratio of the two or more NMOS transistors and/or the bias voltage applied to the transistors may be adjusted to set the summed current to the zero temperature coefficient point.

In the above described embodiments, the sense amplifier with the temperature compensated reference current is applied to a flash memory device for reading out stored data in the flash memory cell. In other embodiments, the sense amplifier with the temperature compensated reference current can be applied to other circuits for sensing the current or voltage value at a given node. The above description is illustrative only and not intended to be limiting.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A non-volatile memory device, comprising:
   a two-dimensional array of non-volatile memory cells, each memory cell being adapted to store one bit of data, each memory cell being accessed by a word line and a bit line;
   a reference current generating circuit configured to generate a reference current at a current summing node using a pair of NMOS transistors connected in parallel between the current summing node and a ground potential, the pair of NMOS transistors including a first NMOS transistor biased by a first bias voltage and having a first gate oxide thickness, and a second NMOS transistor biased by a second bias voltage and having a second gate oxide thickness, the first gate oxide thickness greater than the second gate oxide thickness and the first NMOS transistor and the second NMOS transistor having different voltage ratings, the reference current being the sum of drain currents of the pair of NMOS transistors as biased by the first and second bias voltages, the reference current not varying substantially with temperature;
   a sense amplifier configured to receive a signal indicative of the reference current and further to receive a signal indicative of a bit line current in response to a memory cell being selected for access by activating the respective word line and the respective bit line, the sense amplifier being configured to sense the difference between the bit line current flowing in the selected memory cell and the reference current and to generate an output signal indicative of the difference.

2. The non-volatile memory device of claim 1, wherein the first bias voltage and the second bias voltage are generated from a single voltage source having a first fixed voltage value or from separate voltage sources each having a first fixed voltage value.

3. The non-volatile memory device of claim 2, wherein the first NMOS transistor has a first transistor width and the second NMOS transistor has a second transistor width, the first and second transistor widths being varied to set the summed drain currents to a current value not varying substantially with temperature in response to the first and second NMOS transistors being biased by the first fixed voltage value.

4. The non-volatile memory device of claim 2, wherein the first fixed voltage value comprises a bandgap reference voltage.

5. The non-volatile memory device of claim 2, wherein the first fixed voltage value comprises a CMOS reference voltage.

6. The non-volatile memory device of claim 1, further comprising:
   a reference voltage generator configured to generate the first bias voltage and the second bias voltage, the first bias voltage and the second bias voltage having the same or different voltage values.

7. The non-volatile memory device of claim 6, wherein the reference voltage generator is configured to generate the first bias voltage and the second bias voltage based on a fixed reference voltage.

8. The non-volatile memory device of claim 7, wherein the fixed reference voltage comprises a bandgap reference voltage.

9. The non-volatile memory device of claim 7, wherein the fixed reference voltage comprises a CMOS reference voltage.

10. The non-volatile memory device of claim 1, further comprising:
    a first current-to-voltage converter configured to receive the reference current and to generate a first voltage signal indicative of the reference current, the first voltage signal being provided to the sense amplifier as the signal indicative of the reference current; and
    a second current-to-voltage converter configured to receive the bit line current and to generate a second voltage signal indicative of the bit line current, the second voltage signal being provided to the sense amplifier as the signal indicative of the bit line current.

11. A method of providing a reference current for a sense amplifier in a non-volatile memory device, the method comprising:
    providing a two-dimensional array of non-volatile memory cells, each memory cell being adapted to store one bit of data, each memory cell being accessed by a word line and a bit line;
    providing a first NMOS transistor biased by a first bias voltage and having a first gate oxide thickness;
    providing a second NMOS transistor biased by a second bias voltage and having a second gate oxide thickness, the first gate oxide thickness greater than the second gate oxide thickness and the first NMOS transistor and the second NMOS transistor having different voltage ratings;
    summing drain currents of the first and second NMOS transistors as biased by the first and second bias voltages;
    providing the summed drain current as a reference current, the reference current not varying substantially with temperature;
    providing a signal indicative of the reference current to a sense amplifier;
    receiving at the sense amplifier a signal indicative of a bit line current in response to a memory cell being selected for access by activating a respective word line and a respective bit line;
    sensing at the sense amplifier the difference between the bit line current flowing in the selected memory cell and the reference current; and
    generating an output signal indicative of the difference.

12. The method of claim 11, further comprising:
    generating the first bias voltage and the second bias voltage from a single voltage source having a first fixed voltage value or from separate voltage sources each having a first fixed voltage value.

13. The method of claim 12, further comprising:
adjusting a first transistor width of the first NMOS transistor and a second transistor width of the second NMOS transistor to set the summed drain currents to a current value not varying substantially with temperature in response to the first and second NMOS transistors being biased by the first fixed voltage value.

14. The method of claim 12, wherein the first fixed voltage value comprises a bandgap reference voltage.

15. The method of claim 12, wherein the first fixed voltage value comprises a CMOS reference voltage.

16. The method of claim 11, further comprising:
generating the first bias voltage and the second bias voltage from a fixed reference voltage, the first bias voltage and the second bias voltage having the same or different voltage values.

17. The method of claim 16, wherein the fixed reference voltage comprises a bandgap reference voltage.

18. The method of claim 16, wherein the fixed reference voltage comprises a CMOS reference voltage.

19. The method of claim 11, wherein providing a signal indicative of the reference current to a sense amplifier comprises:
converting the reference current to a voltage signal; and
providing the voltage signal indicative of the reference current to the sense amplifier.

20. The method of claim 11, wherein receiving at the sense amplifier a signal indicative of a bit line current comprises:
converting the bit line current to a voltage signal; and
providing the voltage signal indicative of the bit line current to the sense amplifier.

\* \* \* \* \*